United States Patent
Kurashima et al.

(10) Patent No.: US 8,451,888 B2
(45) Date of Patent: May 28, 2013

(54) COMMUNICATION APPARATUS

(75) Inventors: Shigemi Kurashima, Shinagawa (JP); Masahiro Yanagi, Shinagawa (JP); Hiroto Inoue, Shinagawa (JP); Takuya Uchiyama, Shinagawa (JP); Takashi Arita, Shinagawa (JP); Hideki Iwata, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 1345 days.

(21) Appl. No.: 11/207,849

(22) Filed: Aug. 22, 2005

(65) Prior Publication Data
US 2006/0045177 A1 Mar. 2, 2006

(30) Foreign Application Priority Data

Aug. 24, 2004 (JP) ................. 2004-244291
Jan. 26, 2005 (JP) ................. 2005-017786

(51) Int. Cl.
*H03K 7/04* (2006.01)
(52) U.S. Cl.
USPC ........... 375/239; 375/130; 375/135; 375/136; 375/146; 375/295; 375/216; 375/259; 375/260; 375/267; 375/316; 375/238
(58) Field of Classification Search
USPC ............... 375/256, 261, 295, 130, 240, 309, 375/140–141, 146, 219, 242, 316, 340, 349, 375/353, 373, 376–377, 135, 136, 147, 216, 375/239, 259, 260, 267, 131; 455/102, 522, 455/91; 370/213
See application file for complete search history.

(56) References Cited

U.S. PATENT DOCUMENTS

| | | | | |
|---|---|---|---|---|
| 3,090,953 | A * | 5/1963 | Frank | 342/201 |
| 6,026,125 | A * | 2/2000 | Larrick et al. | 375/295 |
| 6,456,221 | B2 * | 9/2002 | Low et al. | 341/157 |
| 6,529,568 | B1 * | 3/2003 | Richards et al. | 375/346 |
| 6,693,470 | B1 * | 2/2004 | Tiuraniemi | 327/129 |
| 6,697,628 | B1 * | 2/2004 | Green et al. | 455/456.1 |
| 6,760,803 | B1 * | 7/2004 | Gauvin et al. | 710/305 |
| 6,967,945 | B2 * | 11/2005 | Hethuin et al. | 370/350 |
| 6,970,496 | B1 * | 11/2005 | Ben-Bassat et al. | 375/141 |
| 7,020,224 | B2 * | 3/2006 | Krivokapic | 375/343 |
| 7,079,589 | B1 * | 7/2006 | Maksimovic et al. | 375/295 |
| 7,233,804 | B2 * | 6/2007 | Sugaya et al. | 455/501 |
| 7,280,607 | B2 * | 10/2007 | McCorkle et al. | 375/295 |

(Continued)

FOREIGN PATENT DOCUMENTS

| | | |
|---|---|---|
| EP | 1295405 | 3/2003 |
| JP | 7-44514 | 5/1995 |

(Continued)

OTHER PUBLICATIONS

Buchegger et al. "Pulse Delay Techniques for PPM Impulse Radio Transmitters", IEEE Nov. 2003.*

(Continued)

*Primary Examiner* — Sophia Vlahos
(74) *Attorney, Agent, or Firm* — Staas & Halsey LLP

(57) ABSTRACT

An impulse communication apparatus includes an impulse train generating part generating an impulse train from one modulated pulse by on-off keying, and an impulse train sending part sending the impulse train generated by the impulse train generating part.

16 Claims, 14 Drawing Sheets

U.S. PATENT DOCUMENTS

| | | | |
|---|---|---|---|
| 7,292,620 B2* | 11/2007 | Green et al. | 375/146 |
| 7,405,658 B2* | 7/2008 | Richards | 340/572.4 |
| 2003/0112862 A1* | 6/2003 | Joe et al. | 375/238 |
| 2004/0047429 A1* | 3/2004 | Hsu | 375/295 |
| 2004/0125859 A1* | 7/2004 | Green et al. | 375/146 |

FOREIGN PATENT DOCUMENTS

| | | |
|---|---|---|
| JP | 8-213972 | 8/1996 |
| JP | 8-509110 | 9/1996 |
| JP | 2002-135342 | 5/2002 |
| JP | 2003-535552 | 11/2003 |

OTHER PUBLICATIONS

Communication from the Japanese Patent Office mailed on Jul. 6, 2010 in Japanese Patent Application No. 2005-017786.

* cited by examiner

COMMUNICATION APPARATUS

BACKGROUND OF THE INVENTION

1. Field of the Invention

The present invention relates to a communication apparatus that handles communications utilizing impulses.

2. Description of the Related Art

Recently, attention has been drawn to ultra wideband (UWB) communications. The USB communications may be categorized into communications in which the carrier is modulated by DD-SS (Direct Sequence Spectrum Spread) and communications in which impulses are directly sent and received without any carrier. The former type of communications is disclosed in Japanese Patent Publication No. 7-44514 (Document 1), and the latter type is disclosed in Japanese Patent Application Publication No. 8-509110 (Document 2).

The DD-SS type communications need a spreading code at both the transmission and reception sides. The spreading code is used for spreading at the transmission side and for dispreading at the reception side. In addition, the reception side is required to perform acquisition and tracking of synchronization. Thus, the DD-SS type communications need complicated structures and sequences.

In contrast, the communications in which impulses are directly sent and received do not need spreading and dispreading, but requires the reception side to be synchronized with the transmission side. For this requirement, the transmitter generates and sends a pulse for synchronization (synchronous pulse) to the receiver, which receives the synchronous pulse and establishes synchronization with the transmitter. For example, a radar apparatus shown in FIGS. 20 and 21 disclosed in Document 2 function as a receiver required to utilize the received synchronous pulse for establishing synchronization with the transmitter. However, there is a difficulty in establishment of synchronization between the transmitter and the receiver, particularly when the period of impulses is relatively short. Thus, even the communications in which the impulses are directly sent and received need complicated structures and sequences like the DD-SS type communications.

SUMMARY OF THE INVENTION

The present invention has been made in view of the above circumstances and has an object of providing a communication apparatus in which impulse communications take place with a simplified structure and sequence.

According to an aspect of the present invention, there is provided an impulse communication apparatus comprising: an impulse train generating part generating an impulse train from one modulated pulse by on-off keying; and an impulse train sending part sending the impulse train generated by the impulse train generating part.

According to another aspect of the present invention, there is provided an impulse communication apparatus comprising: an impulse train receiving part that receives an impulse train obtained by performing an on/off keying for one modulated pulse; and an impulse train detector part that detects the impulse train received by the impulse train receiving part.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to the accompanying drawings, of embodiments of the present invention.

Figure 1:
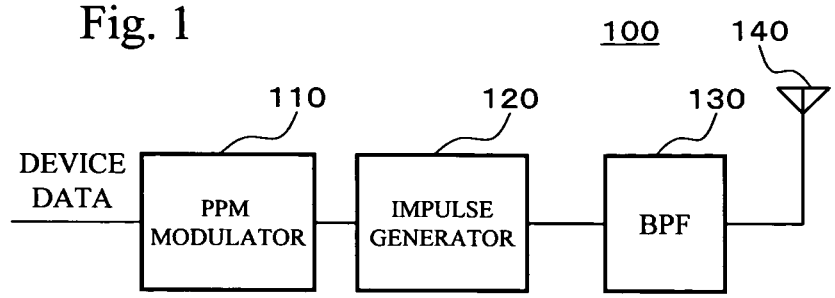
FIG. 1 is a block diagram of a transmitter.

FIG. 1 is a block diagram of a communication apparatus at the transmission side (transmitter). A transmitter 100 shown in FIG. 1 may be built in a keyboard or mouse of a personal computer, and includes a PPM (Pulse Position Modulation) modulator 110, an impulse train generator unit 120, a band-pass filter (BPF) 130 and an antenna 140.

Figure 2:
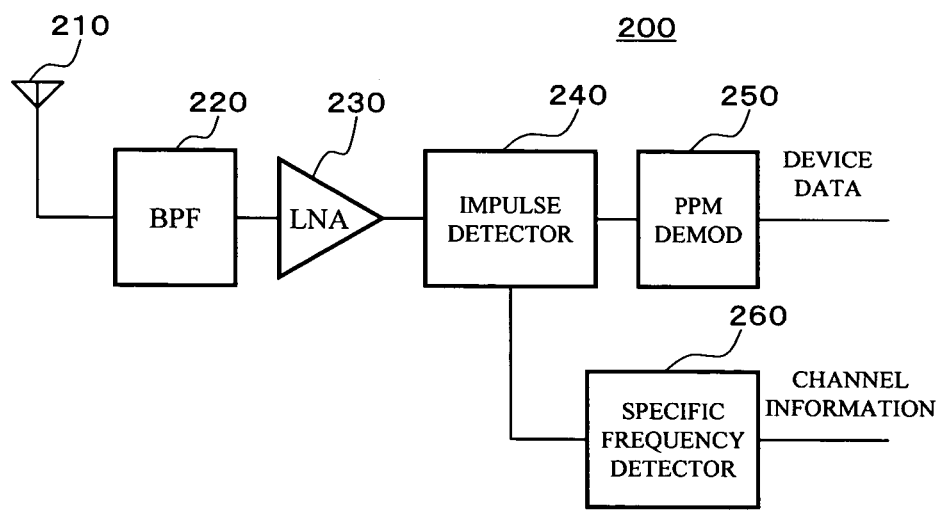
FIG. 2 is a block diagram of a receiver.

FIG. 2 is a block diagram of a communication apparatus at the reception side (receiver). A receiver 200 shown in FIG. 2 may be built in the main body of the personal computer, and includes an antenna 210, a BPF 220, a low-noise amplifier (LNA) 230, an impulse detector 240, a PPM demodulator 250, and a specific-frequency detector 260.

The transmitter 100 operates as follows.

Figure 5:
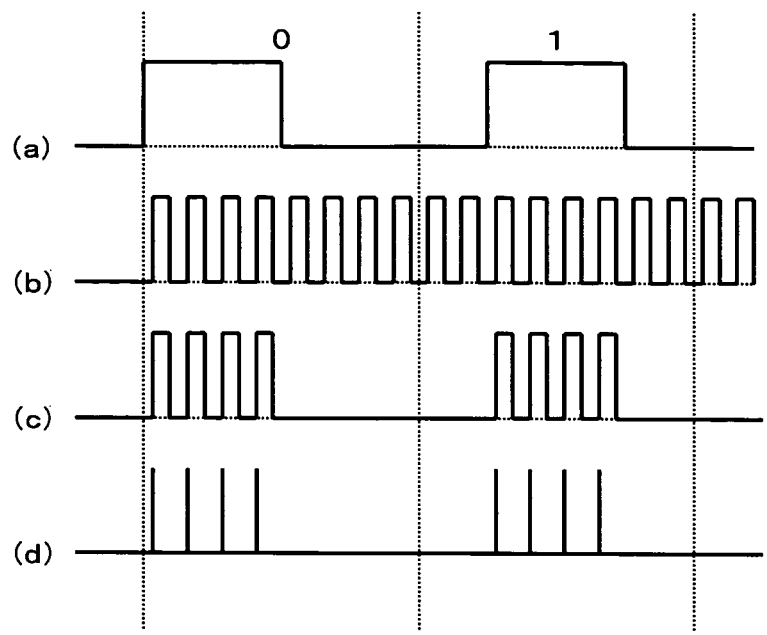
FIG. 5 shows first exemplary signal waveforms in the transmitter.

The PPM modulator 110 is supplied with device data, which may be data based on an operation of the keyboard or mouse and are a train of pulses dependent on units "0" and "1" of information. The PPM modulator 110 PPM-modulates the received device data, and produces modulated pulses. For instance, as shown in FIG. 5(a), the modulated pulses are arranged so as to have different pulse positions for "0" and "1" and make it possible to identify information by referring to the pulse positions. The impulse train generator unit 120 receives the modulated pulses produced by the PPM modulation at the PPM modulator 110, and performs an on-off keying (OOK) process for the modulated pulses, so that an impulse train can be produced.

Figure 3:
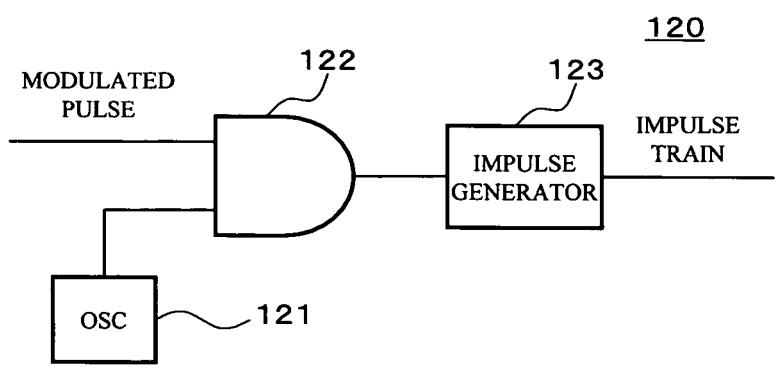
FIG. 3 is a block diagram of an impulse generator unit.

FIG. 3 is a block diagram of the impulse train generator unit 120, which includes an oscillator 121, an AND circuit 122 and an impulse generator 123. The AND circuit 122 is supplied with the modulated pulses from the PPM modulator 102 and pulses from the oscillator 121. As shown in FIG. 5(b), the oscillator 121 may successively generate pulses with a given constant period. The period of pulses generated by the oscillator 121 is shorter than the pulse width of the modulated pulses, and coincides with the period of impulses sent to the receiver 200 from the transmitter 100 (equal to, for example, hundreds of nanoseconds).

The AND circuit 122 produces pulses based on the AND operation on the modulated pulses and the pulses from the oscillator 121. For example, the AND circuit 122 receives the modulated pulse shown in FIG. 5(a) and the pulse generated by the oscillator 121 shown in FIG. 5(b), and produces a resultant pulse having a waveform shown in FIG. 5C and based on the AND operation thereon.

Figure 4:
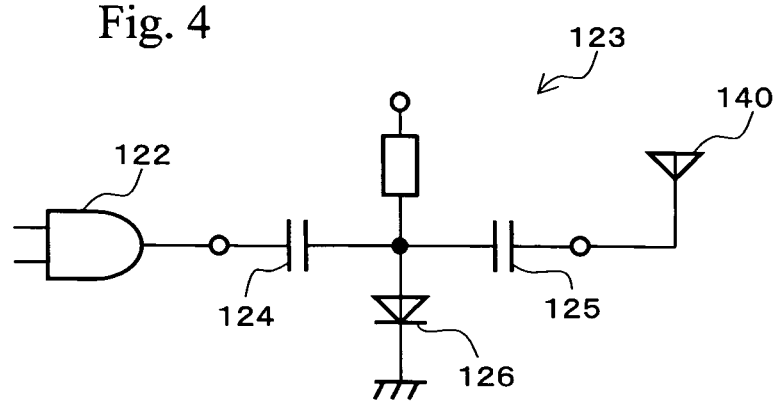
FIG. 4 is a block diagram of an impulse generator.

As shown in FIG. 4, the impulse generator 123 includes capacitors 124 and 125 provided between the AND circuit 122 and the antenna 140, and a step recovery diode 126 connected between a node via which the capacitors 124 and 125 are connected in series and ground. The impulse generator 123 thus configured is capable of realizing high-speed switching.

The impulse generator 123 generates impulses in synchronism with the rising edges of the pulses from the AND circuit 122. For example, the impulse generator 123 receives the pulses shown in FIG. 5(c) and based on the AND operation by the AND circuit 122, and generates resultant impulses shown in FIG. 5(d). The impulse generator 123 is not essentially required to generate the impulses in synchronism with the rising edges of the pulses from the AND circuit 122 but may generate impulses in synchronism with the falling edges thereof. In this manner, a plurality of impulses (a train of impulses) are associated with each modulated pulse, in other words, each unit of information "0" or "1" that forms device data. The BPF 130 receives the train of impulses generated by the impulse train generator unit 120, and eliminates noise components therefrom, so that only frequency components corresponding to the impulse train can be output. The antenna 140 sends the impulse train from the BPF 130.

The receiver 200 operates as follows.

The antenna 210 receives the impulse train from the transmitter 100. The BPF 220 receives the impulse train via the antenna 210, and eliminates noise components therefrom, so that only frequency components corresponding to the impulse train can be output. The low-noise amplifier (LNA) 230 amplifies the impulse train from the BPF 220.

Figure 6:
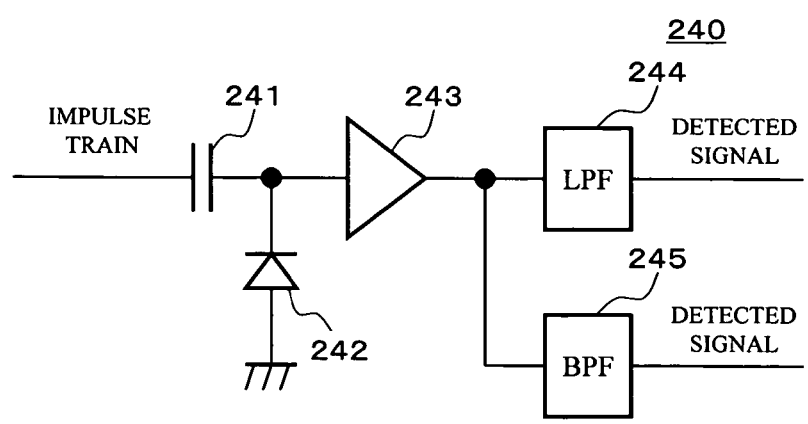
FIG. 6 is a block diagram of an impulse detector.

The impulse detector 240 detects the impulse train from the LNA 230. FIG. 6 is a block diagram of the impulse detector 240, which includes a capacitor 241, a Schottky barrier diode 242, an amplifier 243, a low-pass filter (LPF) 244 and a BPF 245.

The capacitor 241 eliminates the DC component from each impulse of the impulse train applied thereto. The Schottky barrier diode 242 converts the impulses from which the DC components have been removed into pulses. For example, when the impulse has a width equal to hundreds of picoseconds, this impulse is converted into a pulse having a width equal to hundreds of nanoseconds by the Schottky barrier diode 242.

Figure 7:
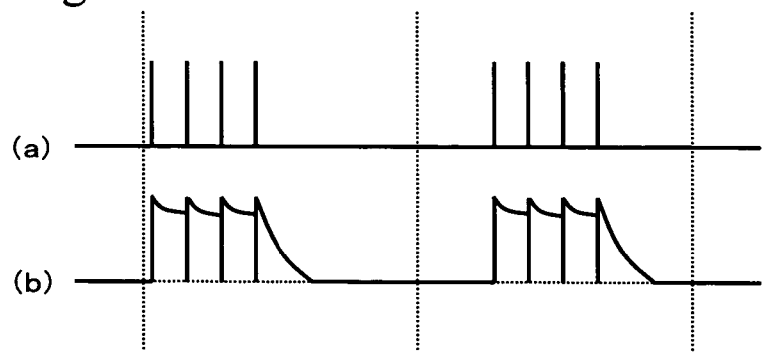
FIG. 7 shows exemplary signal waveforms in the receiver.

The amplifier 243 amplifies the pulse train resulting from the converting process by the Schottky barrier diode 242. The LPF 244 eliminates low-frequency components from the amplified pulse train from the amplifier 243. The pulse train thus obtained is output, as a detected signal, to the PPM demodulator 250. For example, when the impulse train applied to the impulse detector 240 is as shown in FIG. 7(a), the detected signal has a waveform shown in FIG. 7(b). The cutoff frequency of the LPF 244 is set sufficiently lower than the period of impulses. Thus, the time at which the modulated pulses reach the peaks at the transmitter 100 substantially coincides with the time at which the pulse train obtained by detection is at the peaks.

The PPM demodulator 250 receives the detected signal from the impulse detector 240, and reproduces the original device data.

As described above, the transmitter 100 in the present embodiment associates a plurality of impulses (impulse train) with each modulated pulse that corresponds to each unit of information, which forms the device data, and sends the impulse train thus obtained. The receiver 200 receives the impulse train and detects it, so that the original device data can be reproduced. In the above transmission and reception, the transmitter 100 and the receiver 200 are not synchronized with each other on the impulse basis. However, it is to be noted that the multiple impulses are associated with each unit of information that forms the device data. Thus, even if some impulses are lost, the receiver 200 is capable of reproducing the device data by using the remaining impulses. It is thus possible to simplify the structure and sequence for establishment of synchronization and realize communications substantially immune to noise.

In the above-mentioned embodiment, the impulse train that is transmitted and received has the single period. Alternatively, the impulse generator unit 120 in the transmitter 100 may select the period of the impulse train at random. This makes it possible to prevent communication power from concentrating on a specific frequency.

Although the above-mentioned embodiment is directed to a case where a single communication channel is used, the present invention may be applied to a case where multiple channels are used. More specifically, the transmitter 100 may be configured so that the period of the impulse train is determined on the communication channel basis or the widths of the modulated pulses are determined on the communication channel basis.

In the case where each communication channel is assigned the respective period of the impulse train, the oscillator 121 in the impulse generator unit 120 of the transmitter 100 alters the period of pulses for each communication channel on the basis of external information about the communication channels. The AND circuit 122 outputs pulses based on the AND operation on the pulses with the period based on the involved communication channel and the modulated pulses. The impulse generator 123 generates impulses in response to the rising edges of the pulses from the AND circuit 122.

Figure 8:
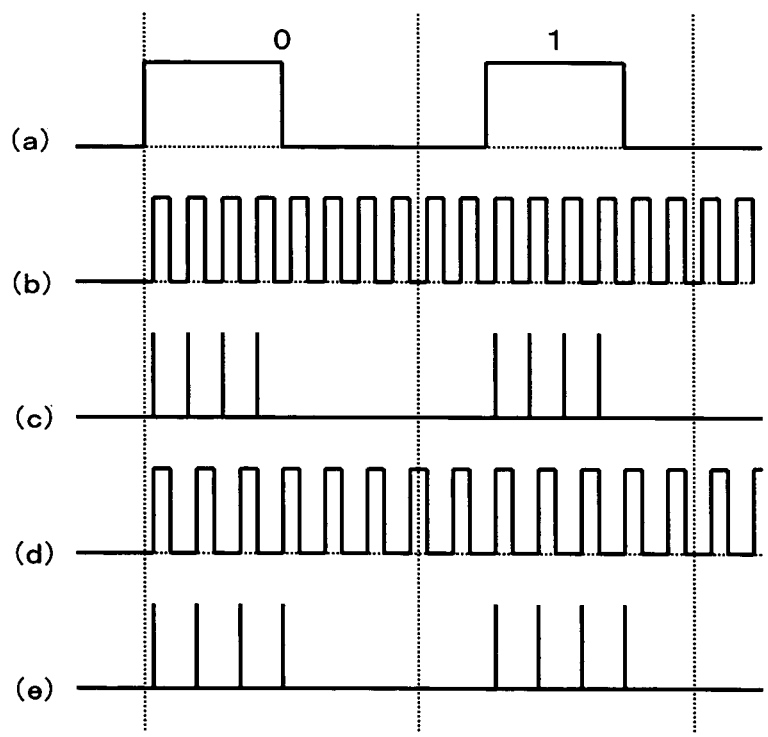
FIG. 8 shows second exemplary signal waveforms in the transmitter.

It is now considered that the modulated pulses have waveforms shown in FIG. 8(a). When communications take place using a specific channel (first communication channel), the oscillator 121 generates pulses having waveforms shown in FIG. 8(b). The impulse generator unit 120 generates a train of pulses as shown in FIG. 8(c).

When communications take place using another specific (second communication channel), the oscillator 121 generates pulses shown in FIG. 8(d), which pulses have a period longer than that of the pulses shown in FIG. 8(b). The train of impulses generated by the impulse generator unit 120 is as shown in FIG. 8(e), and has a longer period than the impulse train shown in FIG. 8(c).

In the impulse detector 240 in the receiver 200 that receives the impulse train, the DC component is removed from each impulse of the impulse train applied to the capacitor 241 in the same manner as has been described previously. The Schottky barrier diode 242 converts the impulses from which the DC components have been removed into pulses. The amplifier 243 amplifies the pulse train, from which the low-frequency components are removed due to the function of the LPF 244. The pulse train thus obtained is output as the detected signal.

The specific-frequency detector 260 receives the detected signal of the pulse train, and detects the period (frequency) of the pulse train. For example, the specific-frequency detector 260 detects the different periods for the different impulse trains shown in FIGS. 8(c) and 8(e). The detected period is output as channel information. Then, the BPF 245 of the impulse detector 240 provides the PPM demodulator 250 with only the impulse train with the period corresponding to the channel information.

Figure 9:
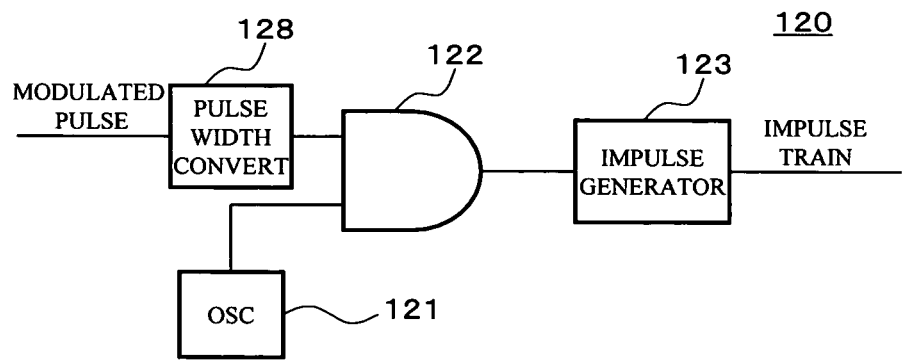
FIG. 9 is a block diagram of another impulse generator unit.

In the case where the modulated pulses are assigned different pulse widths for the different communication channels, the impulse generator unit 120 of the transmitter 100 is newly equipped with a pulse width converter 128, as shown in FIG. 9. The pulse width converter 128 changes the pulse widths of the modulated pulses from the PPM modulator 110 on the basis of the external information about the communication channels. The AND circuit 122 outputs pulses corresponding to the AND operation on the modulated pulses having different pulse widths for different communication channels and the pulses from the oscillator 121. The impulse generator 123 generates impulses for each of the pulses from the AND circuit 122 as has been described previously.

Figure 10:
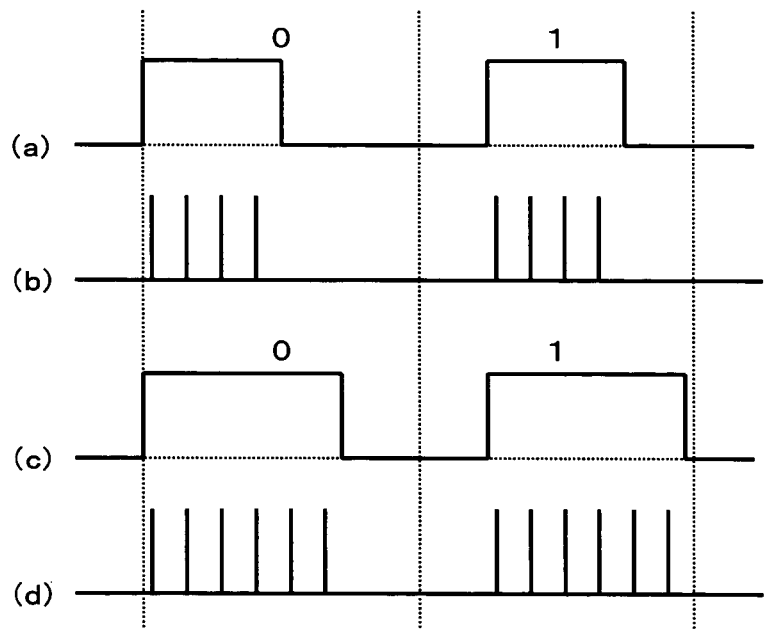
FIG. 10 shows third exemplary signal waveforms in the transmitter.

For example, it is considered that the impulse generator unit 120 is supplied with the modulated pulses shown in FIG. 10(a). When communications take place using a specific channel (first communication channel), the pulse width converter 128 outputs modulated pulses having waveforms shown in FIG. 10(a). Thus, the train of pulses generated by the impulse generator unit 120 is as shown in FIG. 10(b).

When communications take place using another specific (second communication channel), the pulse width converter 128 outputs modulated pulses having waveforms shown in FIG. 10(c), which are wider than those of the modulated pulses shown in FIG. 10(a). Thus, the train of pulses generated by the impulse generator unit 120 is as shown in FIG. 10(d), and has a larger number of impulses than that shown in FIG. 10(b).

Figure 11:
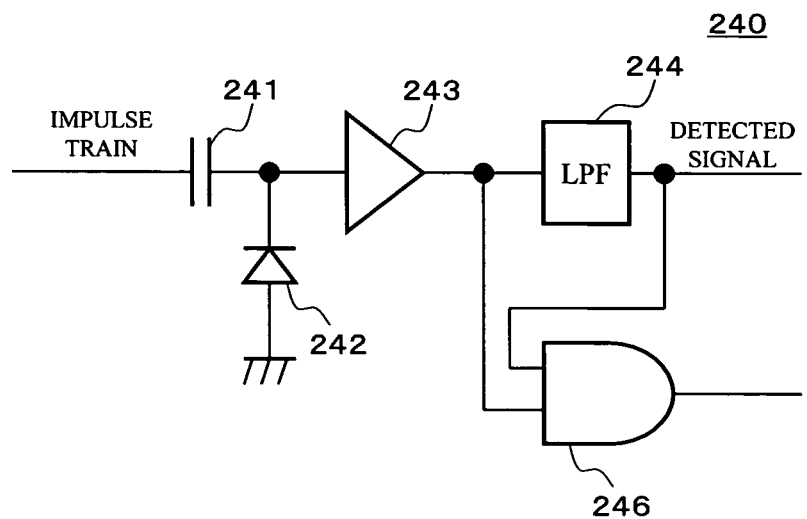
FIG. 11 is a block diagram of another impulse detector.

The impulse detector 240 of the receiver 200 that receives the impulse train is newly equipped with an AND circuit 246 instead of the pulse detector 240, as shown in FIG. 11. In the impulse detector 240, the capacitor 241 eliminates the DC components from each impulse of the impulse train applied thereto. The Schottky barrier diode 242 converts the impulses from which the DC components have been removed into pulses. The amplifier 243 amplifies the train of pulses, and the LPF 244 removes the low-frequency components therefrom. The resultant signal is output as the detected signal.

The AND circuit 246 outputs, as channel information, the train of pulses based on the AND operation on the pulse train from the amplifier 243 and the pulse train from the LPF 244. In the receiver 200, the PPM modulator 250 reproduces the original device data by utilizing only the detected signal that is the train of pulses equal in number to that related to the involved channel information.

In the transmitter 100, a delay circuit may be provided between the PPM modulator 110 and the impulse generator unit 120. This enables the transmitter 100 to receive the impulse train.

Figure 12:
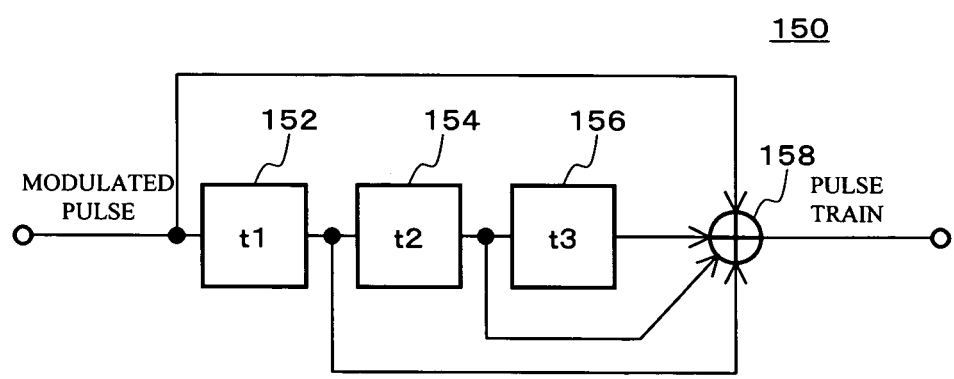
FIG. 12 is a block diagram of a delay circuit.

FIG. 12 is a block diagram of the delay circuit. A delay circuit 150 has a delay element 152, which delays the modulated pulses from the PPM modulator 110 by a time t1. Another delay element 154 of the delay circuit 150 delays the modulated pulses from the delay element 152 by a time t2. Thus, the modulated pulses output by the delay element 154 lag behind the modulated pulses from the PPM modulator 110 by t1+t2. A delay element 156 of the delay circuit 150 delays the modulated pulses from the delay element 154 by a time t3. Thus, the modulated pulses output by the delay element 156 lag behind the modulated pulses by t1+t2+t3. A combiner 158 combines the modulated pulses from the PPM modulator 110 and the delay elements 152, 154 and 156, and outputs combined pulses to the impulse-train generator unit 120. The impulse-train generator unit 120 generates impulses for each of the modulated pulses that form the pulse train from the delay circuit 150.

For instance, it is now considered that the modulated pulses output by the PPM modulator 110 have waveforms as shown in FIG. 13(a). In this case, the delay circuit 150 outputs the applied modulated pulses without any modification, as shown in FIG. 13(b). In addition, the delay circuit 150 outputs the modulated pulses delayed by time t1, those delayed by time t1+t2 and those delayed by time t1+t2+t3. That is, each of the modulated pulses is spread to four modulated pulses. Then, the impulse generator unit 120 generates four impulses that correspond to the four modulated pulses from the delay circuit 150, respectively, as shown in FIG. 13(c).

Figure 13:
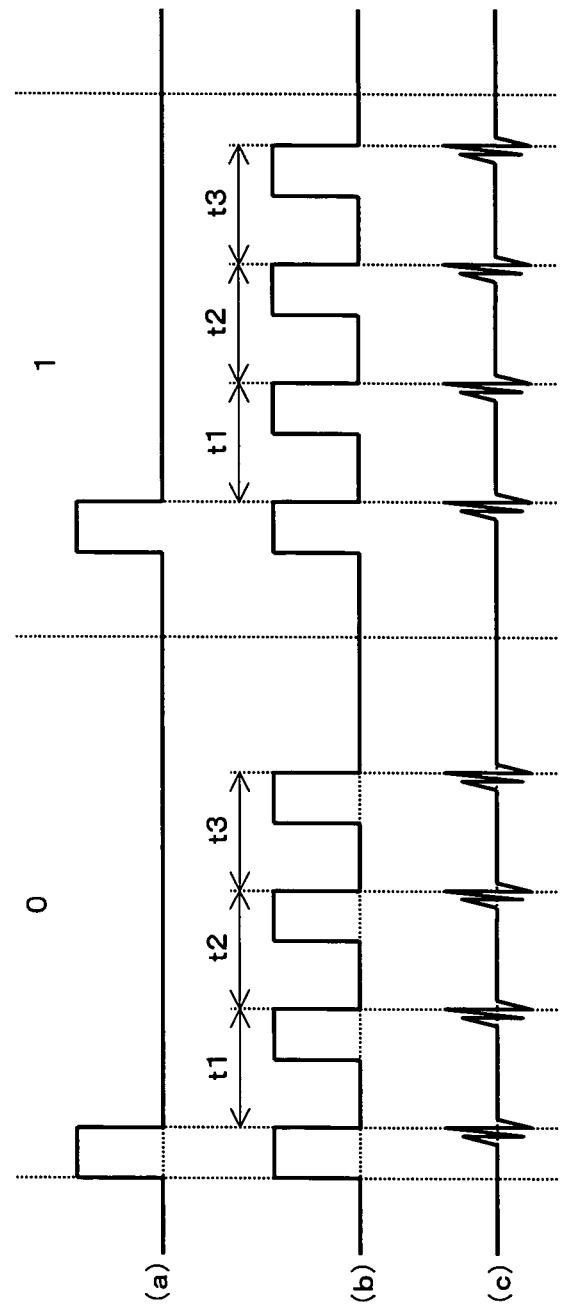
FIG. 13 shows fourth exemplary signal waveforms in the transmitter.
Figure 14:
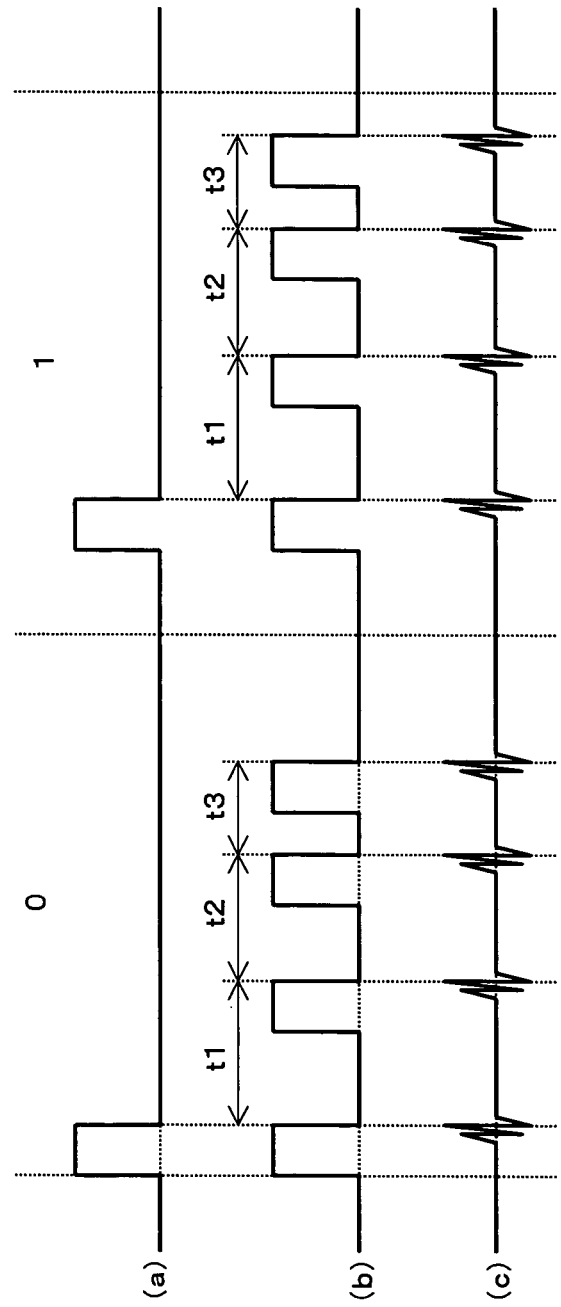
FIG. 14 shows fifth exemplary signal waveforms in the transmitter.
Figure 15A:
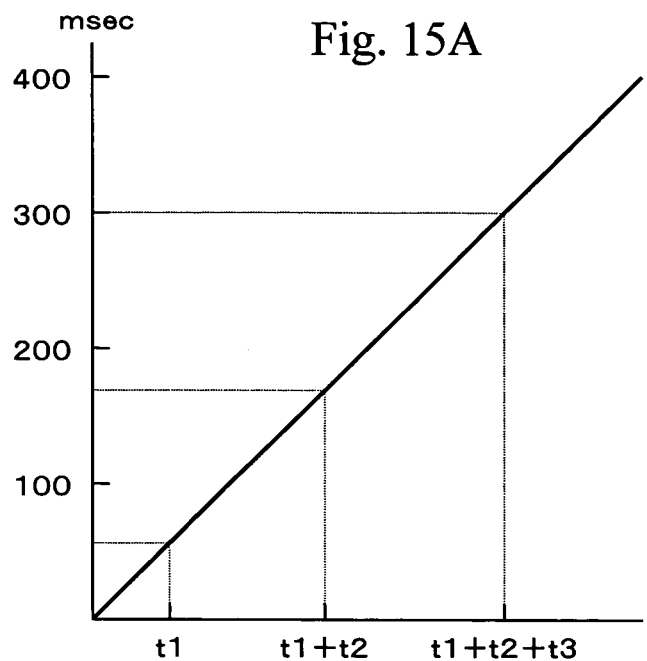
FIGS. 15A and 15B show the nature of delay times.
Figure 15B:
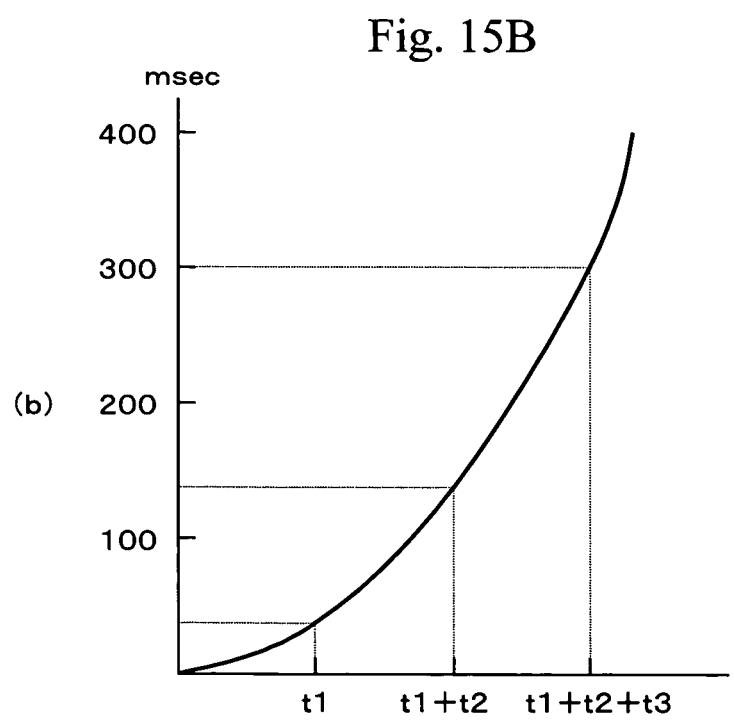

In FIG. 13, the modulated pulses output by the delay circuit 150 are output at constant intervals. In other words, the delay times t1, t1+t2, and t1+t2+t3 are respectively constant. However, the intervals of the modulated pulses may not be constant. For example, when the modulated pulses output by the PPM modulator 110 have waveforms shown in FIG. 14(a), the delay circuit 150 outputs the applied modulated pulses without any modification as shown in FIG. 14(b), those delayed by time t1, those delayed by time t1+t2, and those delayed by time t1+t2+t3. It is to be noted that the delay times t1, t1+t2, and t1+t2+t3 are not constant, but are as shown in FIG. 15A or 15B. The delay times may have a relationship of monotonous increase or decrease. The impulse generator unit 120 generates four impulses that correspond to the four modulated pulses from the delay circuit 150. The differences among the delay times may be at random. The arrangement of the delay times t1, t1+t2, and t1+t2+t3 that are not constant changes the period of the impulse train sent by the transmitter 100 and improves the secrecy of communications.

Figure 16:
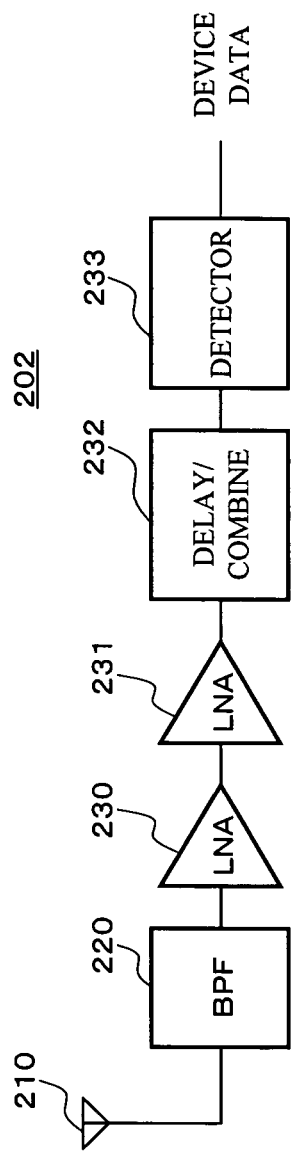
FIG. 16 is a block diagram of another receiver.

FIG. 16 is a block diagram of a receiver, which may be used in connection with the transmitter 100 equipped with the delay circuit 150. A receiver 202 shown in FIG. 16 is configured as follows. The impulse train from the transmitter 100 is received via the antenna 210. The BPF 220 receives the impulse train, and eliminates noise components therefrom, so that only frequency components corresponding to the impulse train can be extracted. The LNAs 230 and 231 amplify the impulse train from the BPF 220.

Figure 17:
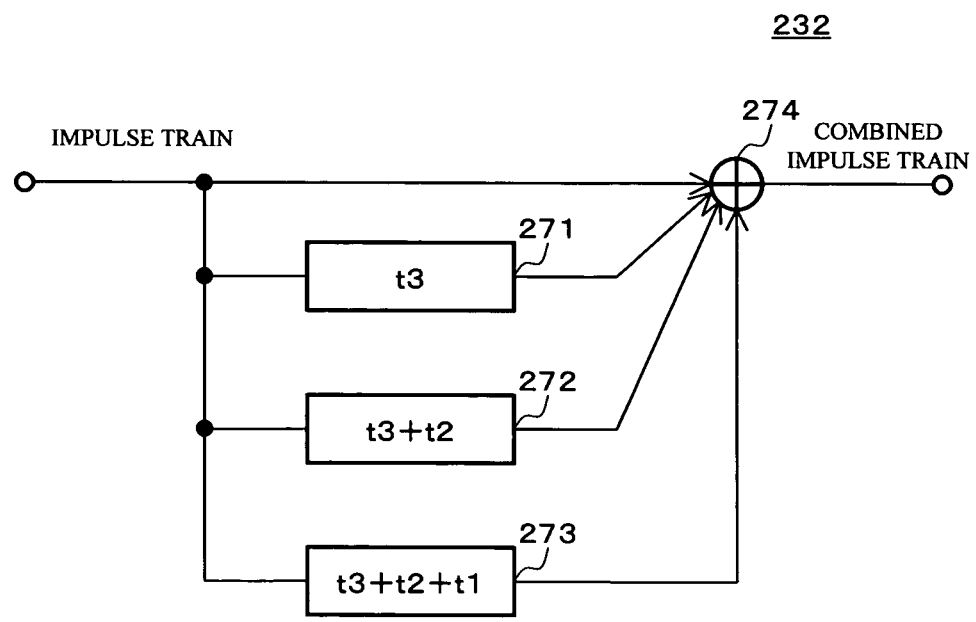
FIG. 17 is a block diagram of a delay/combine circuit.

A delay/combine circuit 232 delays the impulse train from the LNA 231 by multiple times, and combines different impulse trains thus produced. FIG. 17 is a block diagram of the delay/combine circuit 232. The impulse train from the LNA 231 is applied to a combiner 274 without any modification, and is applied to delay elements 271, 272 and 273.

The delay element 271 delays the impulse train from the LNA 231 by time t3. The delay element 272 delays the impulse train from the LNA 231 by time t3+t2. The delay element 273 delays the impulse train from the LNA 231 by time t3+t2+t1.

Figure 19:
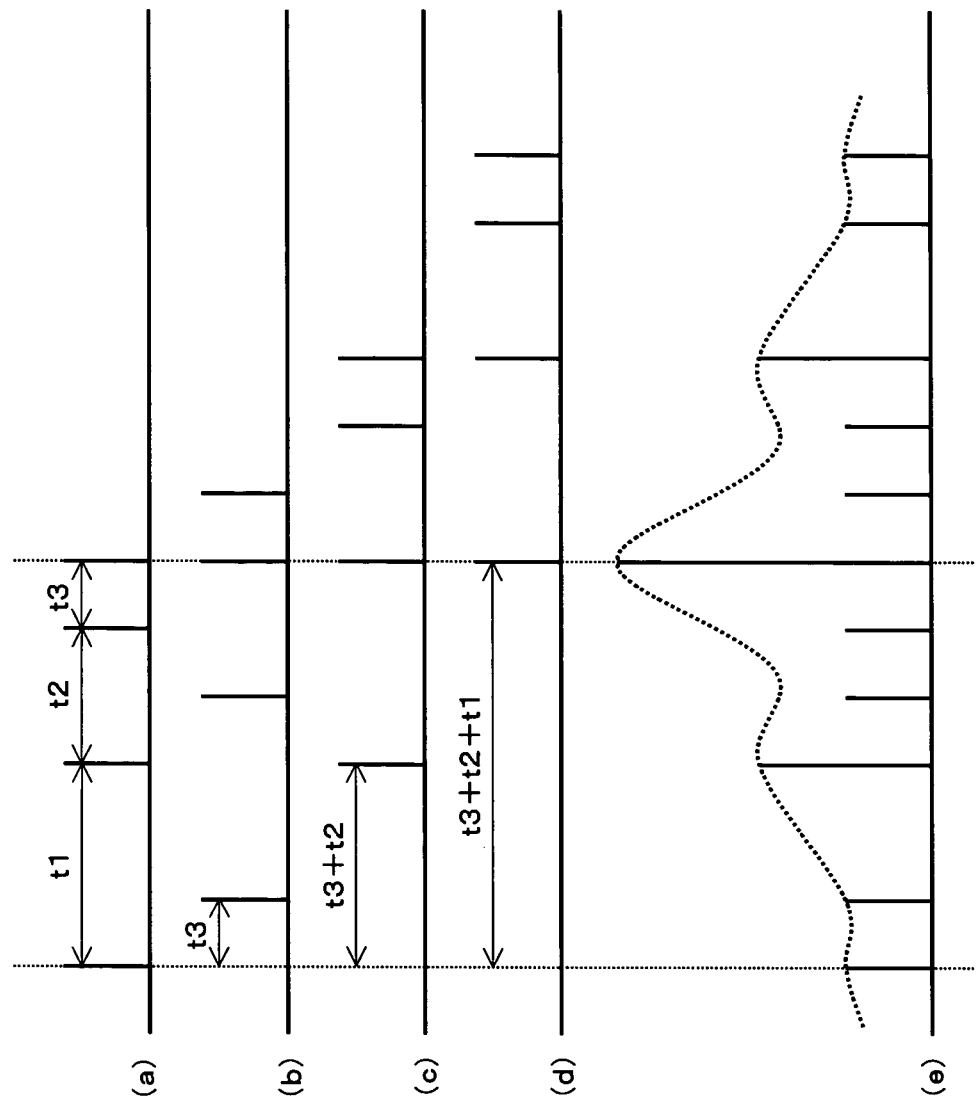
FIG. 19 shows other exemplary signal waveforms in the receiver.
Figure 20:
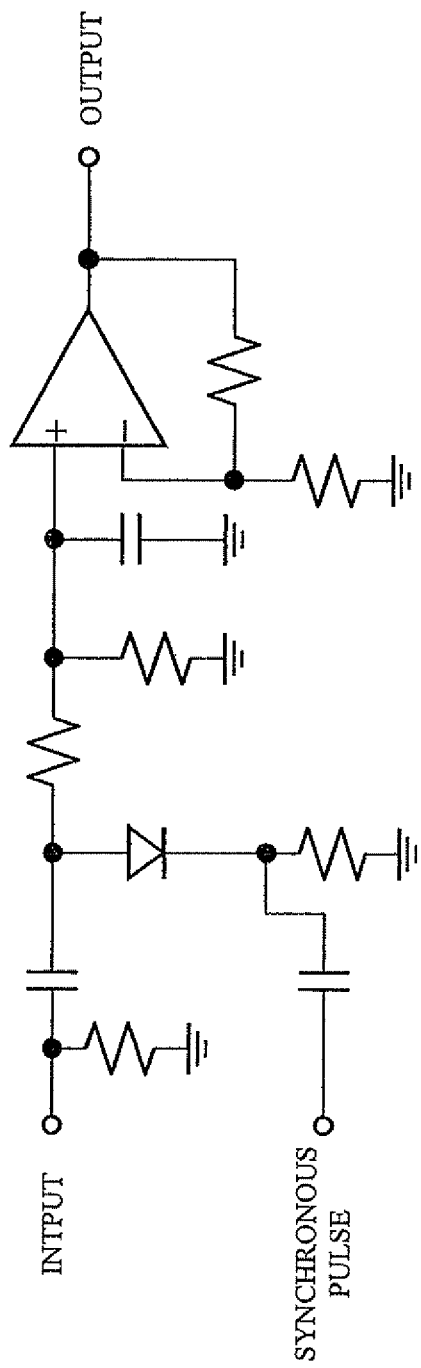
FIG. 20 is a diagram of a first exemplary radar apparatus.
Figure 21:
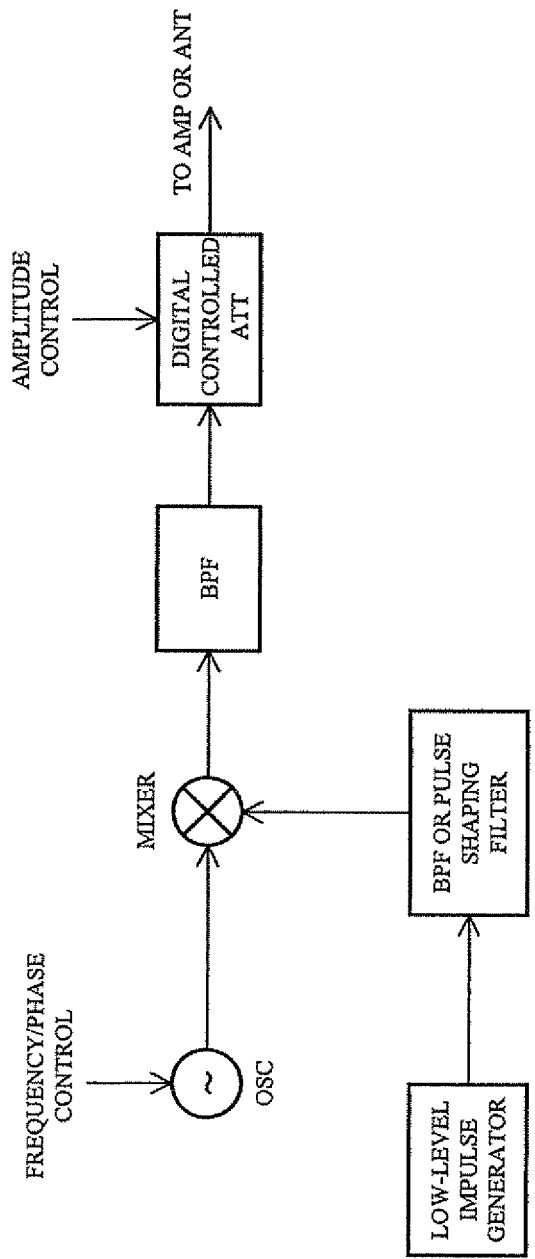
FIG. 21 is a diagram of a second exemplary radar apparatus.

When the impulse train applied to the combiner 274 from the LNA 231 without any modification is as shown in FIG. 19(a), the impulse train applied to the combiner 274 from the delay element 271 is delayed by time t3 as shown in FIG. 19(b), and the impulse train applied to the combiner 274 from the delay element 272 is delayed by time t3+t2 as shown in FIG. 19(c), while the impulse train applied to the combiner 274 from the delay element 273 is delayed by time t3+t2+t1 as shown in FIG. 19(d).

The delay time t3 of the delay element 271 is obtained by subtracting the maximum delay time t1+t2+t3 among the delay times t1, t1+t2 and t1+t2+t3 of the delay circuit 150 in the transmitter 100 from the delay time t1+t2. The delay time t3+t2 of the delay element 272 is obtained by subtracting the delay time t1 from the maximum delay time t1+t2+t3. The delay time t3+t2+t1 of the delay element 273 is the maximum delay time t1+t2+t3 of the delay circuit 150. The delay time of the impulse train applied to the combiner 274 from the LNA 231 without any modification is zero.

The combiner 273 combines the impulse trains from the delay elements 271, 272 and 273, and outputs the combined impulse train to a detector circuit 233.

When the impulse trains shown in FIGS. 19(a) through 19(d) are applied to the combiner 274, the following first through fourth impulses are simultaneously applied to the combiner 274, and a peak appears, as shown in FIG. 19(e). The "fourth" impulse is the fourth impulse of the impulse train applied to the combiner 274 from the LNA 231 without any modification (the impulse delayed by t1+t2+t3 by the delay circuit 150 in the transmitter 100). The "third" impulse is the third one of the impulse train applied to the combiner 274 from the LNA 231 (the impulse delayed by t1+t2 by the delay circuit 150 in the transmitter 100). The "second" impulse is the second impulse of the impulse train applied to the combiner 274 from the LNA 231 (the impulse delayed by t1 by the delay circuit 150 in the transmitter 100). The "first" impulse is the first impulse of the impulse train applied to the combiner 274 from the LNA 231 (the impulse that is not delayed by the delay circuit 150 in the transmitter 100).

Figure 18:
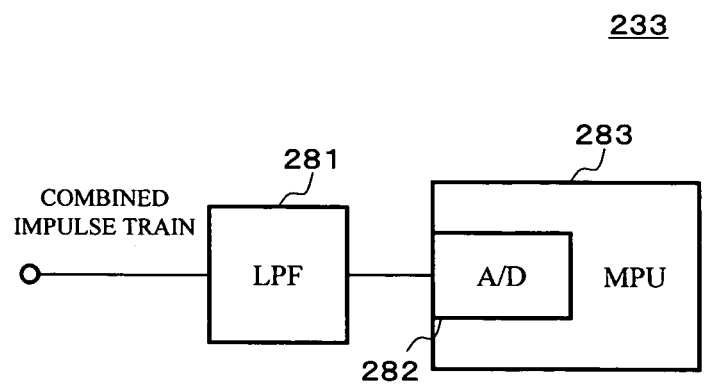
FIG. 18 is a block diagram of a detector circuit.

The detector circuit 233 detects the combined impulse train applied thereto. FIG. 18 is a block diagram of the detector circuit 233. A LPF 281 eliminates low-frequency components from the combined impulse train, and outputs the resultant signal as a detected signal, which has a waveform of an envelope shown by a broken line shown in FIG. 19(e). The cutoff frequency of the LPF 281 is the reciprocal number of the differences among the delay times of the delay circuit 150 in the transmitter 100.

An A/D converter 282 converts the detected signal into digital data. An MPU 283 detects the peaks of the detected signal by referring to the digital data, and regenerates resultant device data.

As described above, the transmitter 100 and the receiver 202 are equipped with the respective delay circuits. It is thus possible to associate multiple impulses with each unit of information that forms the device data. Even if a small number of impulses is lost, the receiver 202 can reproduce the device data by using the remaining impulses. Hence, the structure and sequence for use in establishment of synchronization can be simplified, and communications immune to noise can be realized. In addition, the use of the delay elements realizes high-speed signal processing implemented by hardware only.

The communication apparatus of the present invention enables impulse communications with the simplified structure and sequence.

The present invention may be summarized as follows.

The impulse communication apparatus includes: an impulse train generating part generating an impulse train from one modulated pulse by on-off keying; and an impulse train sending part sending the impulse train generated by the impulse train generating part.

The impulse communication apparatus may be configured so that the impulse train generating part comprises: a first part that generates a pulse; a second part that performs an AND operation on the modulated pulse and the pulse generated by the first part to generate another pulse; and a third part generating the impulse train at a timing defined by said another pulse.

The impulse communication apparatus may be configured so that the third part comprises a step recovery diode. The impulse communication apparatus may be configured so that the modulated pulse is based on pulse position modulation. The impulse communication apparatus may be configured so that the impulse train generating part selects a period of the impulse train based on a communication channel used. The impulse communication apparatus may be configured so that the impulse train generating part selects a pulse width of the impulse train based on a communication channel used. The impulse communication apparatus may be configured so that the impulse train generating part selects a period of the impulse train at random. The impulse communication apparatus may further include a delay circuit that delays the modulated pulse by multiple delay times to thus generate a train of pulses, wherein the impulse train generating part performs the on-off keying for the train of pulses from the delay circuit and generates the impulse train. The impulse communication apparatus may be configured so that the delay circuit includes delay elements associated with the multiple delay times. The impulse communication apparatus may be configured so that the multiple delay times have a relationship of monotonous increase or decrease. The impulse communication apparatus may be configured so that the differences among the delay times are at random.

The impulse communication apparatus includes: an impulse train receiving part that receives an impulse train obtained by performing an on/off keying for one modulated pulse; and an impulse train detector part that detects the impulse train received by the impulse train receiving part.

The impulse communication apparatus may further include a part that identifies a communication channel by referring to the impulse train received by the impulse train receiving part. The impulse communication apparatus may further include a part that identifies a communication channel on the basis of a period of the impulse train received by the impulse train receiving part. The impulse communication apparatus may further include a part that identifies a communication channel on the basis of the number of impulses of the impulse train. The impulse communication apparatus may be configured so that: the impulse train receiving part receives the impulse train obtained by the on-off keying for a train of pulses generated by delaying the modulated pulse by first multiple delay times; the impulse train receiving part comprises a delay/combine part that delays the impulse train by second multiple delay times and combines delayed impulse trains; and the detector part detects a combined impulse train from the delay/combine part. The impulse communication apparatus may be configured so that the second multiple delay times includes a maximum delay time among the first multiple delay times, and delay times obtained by subtracting each of remaining delay times included in the first multiple delay times from the maximum delay time. The impulse communication apparatus may be configured so that the detector part includes a low-pass filter filtering the impulse train, and a peak detecting part that detects a peak of an output signal of the low-pass filter. The impulse communication apparatus may be configured so that the low-pass filter has a cutoff frequency equal to a reciprocal number among the first multiple delay times.

The present invention is not limited to the specifically disclosed embodiments, and variations and modifications may be made without departing from the scope of the present invention.

What is claimed is:

1. An impulse communication apparatus comprising:
    a modulated pulse generating part generating a modulated pulse by performing a pulse position modulation operation to data;
    an impulse train generating part generating an impulse train from the modulated pulse by on-off keying; and
    an impulse train sending part sending the impulse train generated by the impulse train generating part, wherein the impulse train generating part includes:
        a first part that generates a pulse;
        a second part that performs an AND operation on the modulated pulse and the pulse generated by the first part to generate another pulse, a period of the pulse generated by the first part being shorter than a pulse width of the modulated pulse; and
        a third part generating the impulse train, the pulse width of the impulse train being narrower than the pulse width of the another pulse and one pulse of the impulse train corresponding to one pulse of the another pulse, at a timing defined by the another pulse, an impulse of the impulse train being in synchronism with either the rising edge of the another pulse or a falling edge of the another pulse, wherein the third part comprises a step recovery diode, and
    wherein the pulse has multiple sets of a high level and a low level during one high level or low level of the modulated pulse.

2. The impulse communication apparatus as claimed in claim 1, wherein the impulse train generating part selects a period of the impulse train based on a communication channel used.

3. The impulse communication apparatus as claimed in claim 1, wherein the impulse train generating part selects a pulse width of the impulse train based on a communication channel used.

4. The impulse communication apparatus as claimed in claim 1, wherein the impulse train generating part selects a period of the impulse train at random.

5. The impulse communication apparatus as claimed in claim 1, further comprising a delay circuit that delays the modulated pulse by multiple delay times to generate a train of pulses, wherein the impulse train generating part performs the on-off keying for the train of pulses from the delay circuit and generates the impulse train.

6. The impulse communication apparatus as claimed in claim 5, wherein the delay circuit includes delay elements associated with the multiple delay times.

7. The impulse communication apparatus as claimed in claim 5, wherein the multiple delay times have a relationship of monotonous increase or decrease.

8. The impulse communication apparatus as claimed in claim 5, wherein differences among the multiple delay times are random.

9. An impulse communication system comprising:
    a transmitting apparatus that transmits an impulse train; and
    a receiving apparatus that receives the impulse train transmitted from the transmitting apparatus, wherein the transmitting apparatus includes:
        a modulated pulse generating part generating a modulated pulse by performing a pulse position modulation operation to data;
        an impulse train generating part generating the impulse train from the modulated pulse by on-off keying; and
        an impulse train sending part sending the impulse train generated by the impulse train generating part, wherein the impulse train generating part includes:
            a first part that generates a pulse;
            a second part that performs an AND operation on the modulated pulse and the pulse generated by the first part to generate another pulse, a period of the pulse generated by the first part being shorter than a pulse width of the modulated pulse; and
            a third part generating the impulse train, the pulse width of the impulse train being narrower than the pulse width of the another pulse and one pulse of the impulse train corresponding to one pulse of the another pulse, at a timing defined by the another pulse, an impulse of the impulse train being in synchronism with either the rising edge of the another pulse or a falling edge of the another pulse, wherein the third part comprises a step recovery diode, and
    wherein the pulse has multiple sets of a high level and a low level during one high level or low level of the modulated pulse, and
    wherein the receiving apparatus includes:
        an impulse train receiving part that receives the impulse train obtained by performing on-off keying on the modulated pulse; and
        an impulse train detector that detects the impulse train received by the impulse train receiving part.

10. The impulse communication system as claimed in claim 9, further comprising a part that identifies a communication channel by referring to the impulse train received by the impulse train receiving part.

11. The impulse communication system as claimed in claim 9, further comprising a part that identifies a communication channel on the basis of a period of the impulse train received by the impulse train receiving part.

12. The impulse communication system as claimed in claim 9, further comprising a part that identifies a communication channel on the basis of the number of impulses of the impulse train.

13. The impulse communication system as claimed in claim 9, wherein:
    the impulse train receiving part receives the impulse train obtained by the on-off keying for a train of pulses generated by delaying the modulated pulse by first multiple delay times;
    the impulse train receiving part comprises a delay/combine part that delays the impulse train by second multiple delay times and combines delayed impulse trains; and
    the detector part detects a combined impulse train from the delay/combine part.

14. The impulse communication system as claimed in claim 13, wherein the second multiple delay times includes a maximum delay time that is a maximum time of the first multiple delay times, and the second multiple delay times further includes delay times obtained by subtracting remaining delay times of the first multiple delay times from the maximum delay time.

15. The impulse communication system as claimed in claim 13, wherein the detector part includes a low-pass filter filtering the impulse train, and a peak detecting part that detects a peak of an output signal of the low-pass filter.

16. The impulse communication system as claimed in claim 15, wherein the low-pass filter has a cutoff frequency equal to a reciprocal of the first multiple delay times.

* * * * *